(12) United States Patent
Ito

(10) Patent No.: US 7,934,801 B2
(45) Date of Patent: May 3, 2011

(54) METHOD OF MANUFACTURING RECORDING HEAD AND RECORDING HEAD

(75) Inventor: Koji Ito, Gifu (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 809 days.

(21) Appl. No.: 11/955,988

(22) Filed: Dec. 13, 2007

(65) Prior Publication Data

US 2008/0211873 A1    Sep. 4, 2008

(30) Foreign Application Priority Data

Dec. 13, 2006 (JP) ................. 2006-335633

(51) Int. Cl.
B41J 2/14 (2006.01)
B41J 2/16 (2006.01)
(52) U.S. Cl. ............... 347/50; 347/58; 347/72
(58) Field of Classification Search .......... 347/40, 347/42, 48–50, 58, 65, 68, 72
See application file for complete search history.

(56) References Cited

U.S. PATENT DOCUMENTS

| | | | |
|---|---|---|---|
| 7,351,649 B2* | 4/2008 | Shinkai | 438/612 |
| 2004/0113994 A1 | 6/2004 | Shinkai | |
| 2005/0239233 A1 | 10/2005 | Shinkai | |

FOREIGN PATENT DOCUMENTS

| | | |
|---|---|---|
| JP | 2003-318218 A | 11/2003 |
| JP | 2004-136663 A | 5/2004 |
| JP | 2005305847 A | 11/2005 |

OTHER PUBLICATIONS

Japan Patent Office, Notice of Reasons for Rejection in Japanese Patent Application No. 2006-335633 (counterpart to above-captioned U.S. Patent Application) mailed Jan. 6, 2009.

* cited by examiner

Primary Examiner — Thinh H Nguyen
(74) Attorney, Agent, or Firm — Baker Botts L.L.P.

(57) ABSTRACT

A method of manufacturing a recording head according to the present invention includes a plurality of steps to describe as follows. In a solder paste application step, solder paste bodies are partially applied onto a plurality of terminals. In a heating step, each of the plurality of solder paste bodies is heated, to thereby form a plurality of solder layers on the plurality of terminals. In a covering step, the plurality of terminals and the plurality of solder layers are covered by an uncured synthetic resin layer. In a contact step, a plurality of bumps formed in a bump forming step and the plurality of solder layers are contacted with each other, by pressing regions of the synthetic resin layer covering the solder layers and the bumps to each other. In a curing step, the uncured synthetic resin layer is cured.

10 Claims, 15 Drawing Sheets

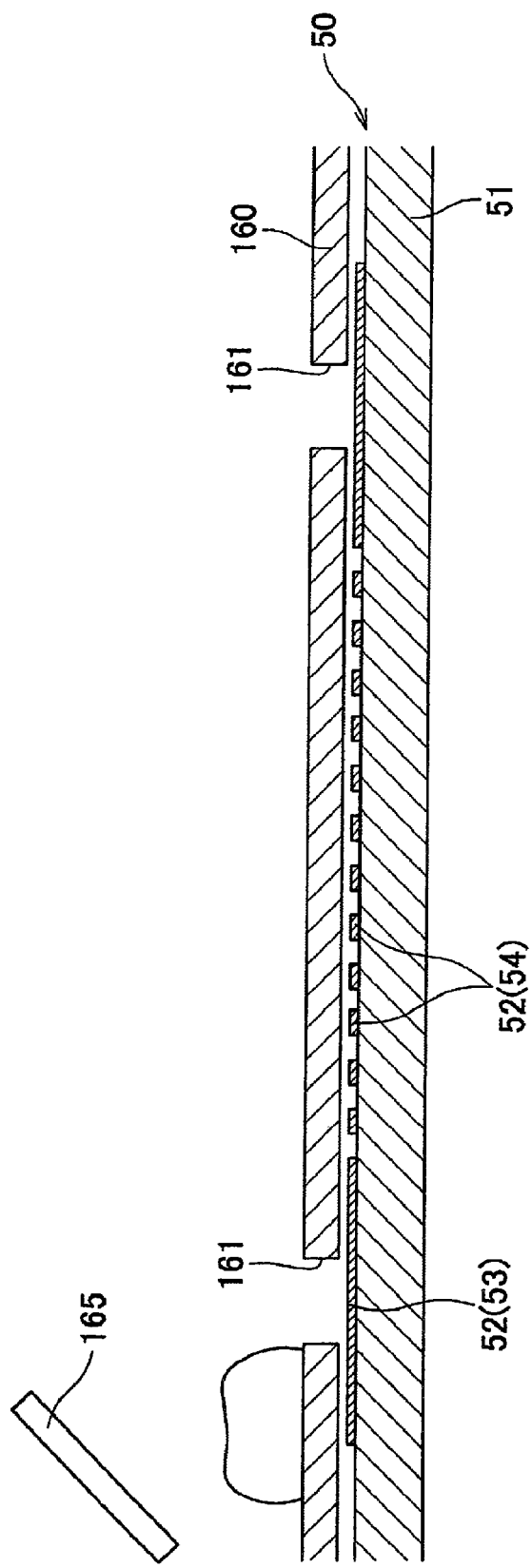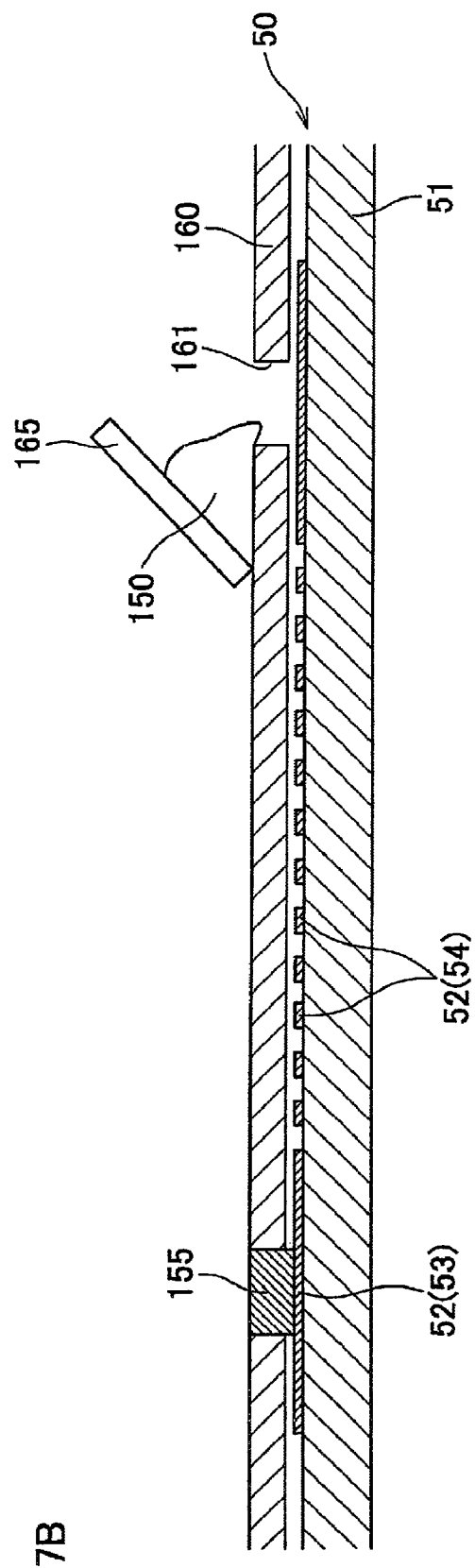

METHOD OF MANUFACTURING RECORDING HEAD AND RECORDING HEAD

CROSS REFERENCE TO RELATED APPLICATION

The present application claims priority from Japanese Patent Application No. 2006-335633, which was filed on Dec. 13, 2006, the disclosure of which is herein incorporated by reference in its entirety.

BACKGROUND OF THE INVENTION

1. Field of the Invention

The present invention relates to a method of manufacturing a recording head which performs recording on a recording medium, and also relates to the recording head.

2. Description of Related Art

A general recording head includes an actuator unit having a plurality of individual electrodes which are provided corresponding to a plurality of recording elements, respectively. A drive signal is selectively supplied to the plurality of the individual electrodes through a printed circuit board which is bonded to the actuator unit. In the actuator unit, when a drive signal is supplied to an individual electrode, a recording element corresponding to this individual electrode is driven and recording is performed on a recording medium.

A recording head disclosed in Japanese Unexamined Patent Publication No. 2005-305847 adopts, as a printed circuit board for supplying a drive signal to an individual electrode, an FPC (Flexible Printed Circuit) in which wirings are formed on a substrate made of a polyimide film. The above-mentioned document discloses a method of electrically connecting terminals included in the wirings formed in the FPC and individual electrodes of an actuator unit.

That is, as shown in FIG. 10, protruding bumps made of a metal material and having conductivity are formed on respective surfaces of the plurality of individual electrodes. On the other hand, solder layers are formed on respective surfaces of a plurality of terminals of the FPC, and an uncured synthetic resin layer is formed on a surface of the substrate so as to cover the plurality of terminals and the solder layers. While the bumps and the solder layers are positioned relative to each other, the FPC is pressed to a face of the actuator unit where the individual electrodes are formed. Thereby, the bumps pass through the uncured synthetic resin and come into contact with the solder layers. Then, the uncured synthetic resin is cured, to bond the actuator unit and the printed circuit board to each other. Here, at a time when the FPC is pressed to the actuator unit, the solder layer functions as a flexible support member for the FPC. Therefore, the bumps and the solder layers can surely be in contact with each other.

SUMMARY OF THE INVENTION

In a manufacturing process of the recording head disclosed in the above-mentioned document, when a solder paste is applied to the surface of the terminal of the FPC to form the solder layer, a very high accuracy is required for a position to which the solder paste is applied. For example, in a case where the solder paste is applied using a mask which has, at its portions corresponding to the respective terminals, openings having substantially the same size as that of the terminal are formed, it is necessary that the openings are formed in the mask at high accuracy and in addition the openings of the mask and the terminals are positioned relative to each other at high accuracy. As a result, costs for manufacturing the recording head increase.

An object of the present invention is to provide a method of manufacturing a recording head which allows an actuator unit and a printed circuit board to be bonded to each other in a preferred manner, and also to provide the recording head.

According to a first aspect of the present invention, there is provided a method of manufacturing a recording head which includes an actuator unit having a plurality of individual electrodes corresponding to a plurality of recording elements, and a flexible printed circuit board which supplies to the individual electrodes a signal for driving the recording elements. The method comprises: a bump forming step to form, on a surface of the actuator unit, a plurality of conductive bumps each electrically connected to each of the plurality of individual electrodes; a solder paste application step to partially apply solder paste bodies onto a plurality of terminals of a wiring which is formed on the printed circuit board; a heating step to heat each of the plurality of solder paste bodies applied onto the plurality of terminals, to thereby form a plurality of solder layers on the plurality of terminals; a covering step to cover the plurality of terminals and the plurality of solder layers by an uncured synthetic resin layer; a contact step to contact the plurality of bumps and the plurality of solder layers with each other, by pressing regions of the synthetic resin layer covering the solder layers and the bumps to each other thereby deforming the synthetic resin layer; and a curing step to cure the uncured synthetic resin layer.

In the above aspect, the solder paste bodies may partially be applied onto the terminals. Thus, freedom is given to a position of application. This can suppress increase in costs which may be caused by a demand for very high accuracy as positional accuracy in application. Therefore, a recording head can be manufactured at low costs, in which the solder layers functioning as a supporter for the flexible printed circuit board in the contact step are formed and therefore the actuator unit and the printed circuit board can be properly bonded to each other.

According to a second aspect of the present invention, there is provided a recording head which includes an actuator unit having a plurality of individual electrodes corresponding to a plurality of recording elements, and a flexible printed circuit board which supplies to the individual electrodes a signal for driving the recording elements. The actuator unit has a plurality of conductive bumps which are formed on a surface of the actuator unit and electrically connected to the plurality of individual electrodes, respectively. The printed circuit board includes a wiring, a first synthetic resin layer, solder layers, and a second synthetic resin layer. The wiring includes a plurality of terminals. The first synthetic resin layer covers the wiring and has a plurality of openings which are larger than the terminals and through which the plurality of terminals are individually exposed. The solder layers are formed by partially applying solder paste bodies onto the plurality of terminals and then heating the solder paste bodies. The second synthetic resin layer covers at least the plurality of openings. Regions of the second synthetic resin layer covering the solder layers and the bumps are pressed to each other to thereby deform the second synthetic resin layer, so that the plurality of bumps and the plurality of solder layers are in contact with each other.

In the above aspect, manufacture costs can be reduced because high accuracy is not required when forming the solder layers. In addition, when pressing the second synthetic resin layer and the bumps to each other to thereby deform the second synthetic resin layer, the solder layers function as a supporter for the flexible printed circuit board. Therefore, the actuator unit and the printed circuit board can be properly bonded to each other. Besides, the terminals are exposed through the openings of the first synthetic resin layer. Accordingly, at a stage before forming the solder layers on the terminals, the first synthetic resin layer can be formed so that the wiring except its portions around the terminals is protected by the first synthetic resin layer. Therefore, adhering of foreign materials to the wiring, which causes a short circuit, can be suppressed.

BRIEF DESCRIPTION OF THE DRAWINGS

Other and further objects, features and advantages of the invention will appear more fully from the following description taken in connection with the accompanying drawings in which:

FIG. 7A shows a state where a metal mask and an FPC are being positioned relative to each other in a solder paste application step during the manufacture process of the ink-jet head shown in FIG. 1;

FIG. 7B shows a state where a solder paste on the metal mask is being spread in the solder paste application step during the manufacture process of the ink-jet head shown in FIG. 1;

DESCRIPTION OF THE PREFERRED EMBODIMENTS

In the following, some preferred embodiments of the present invention will be described with reference to the accompanying drawings. In this embodiment, as an example, the present invention is applied to an ink-jet head which ejects ink.

First Embodiment

Figure 1:
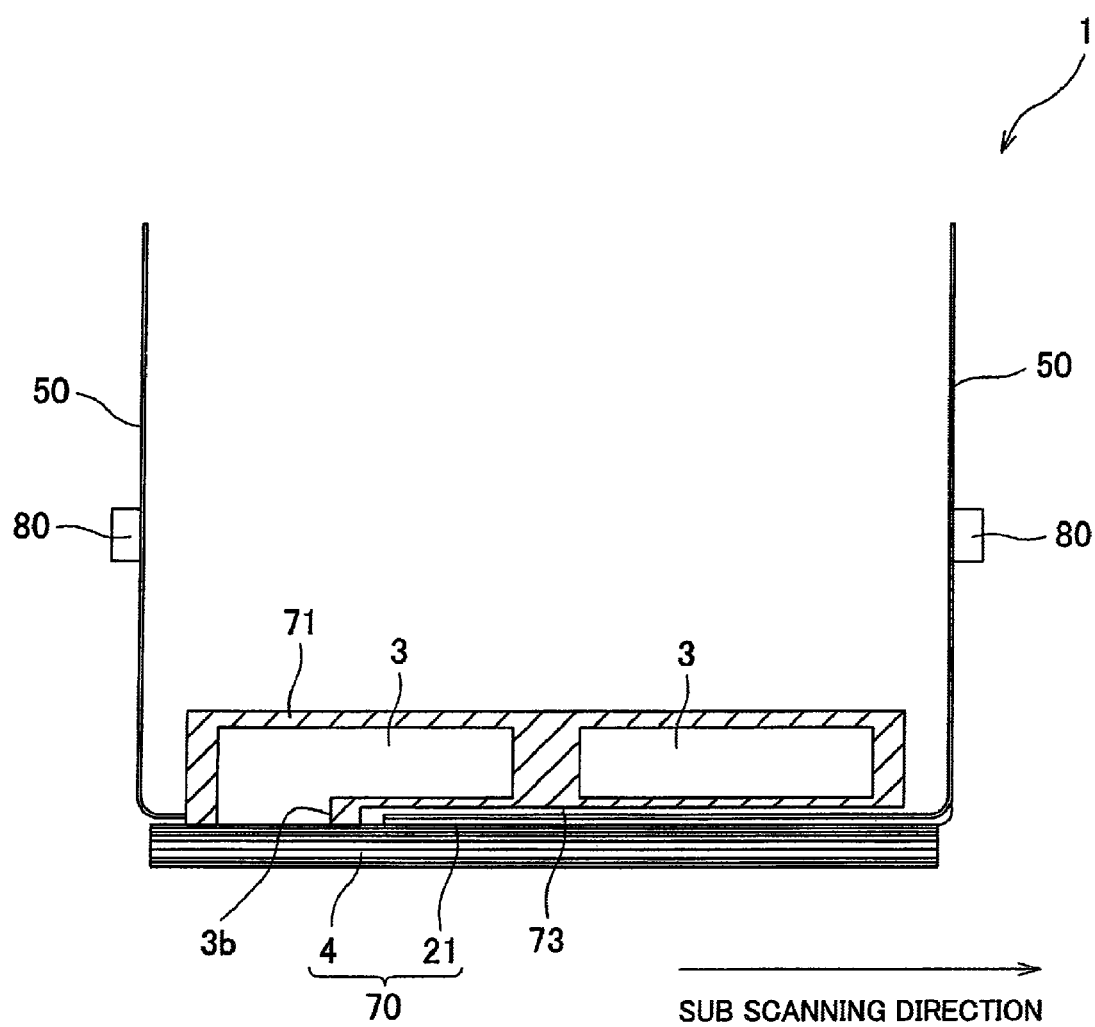
FIG. 1 is a sectional view of an ink-jet head according to a first embodiment of the present invention.
Figure 2:
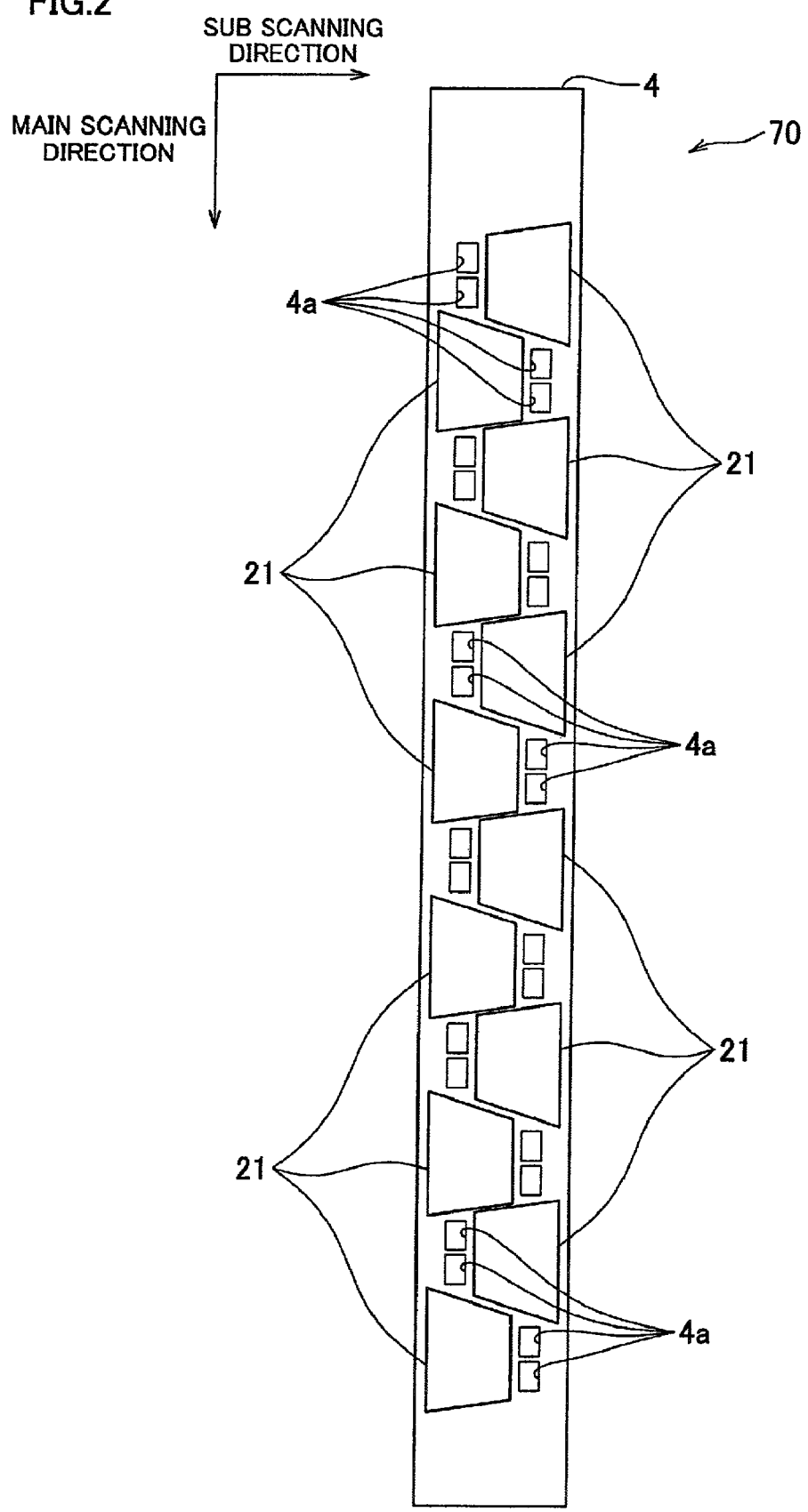
FIG. 2 is a plan view of a head main body shown in FIG. 1.

An ink-jet head of this embodiment is so-called line type one, which is fixedly disposed in such a manner that an ink ejection face locates over an entire recording region with respect to a direction perpendicular to a conveyance direction of a recording paper which is a sub scanning direction, that is, with respect to a main scanning direction. FIG. 1 is a sectional view along the sub scanning direction of the ink-jet head of this embodiment. FIG. 2 is a plan view of a head main body. As shown in FIG. 1, an ink-jet head 1 of this embodiment includes a head main body 70 and a base block 71. The head main body 70 is provided with a plurality of nozzles 8 (see FIG. 3) which eject ink to a recording paper. The base block 71 is disposed above the head main body 70, and formed with two ink reservoirs 3 in which ink to be supplied to the head main body 70 is stored.

In a plan view, as shown in FIG. 2, the head main body 70 has a rectangular shape elongated along the main scanning direction. The head main body 70 includes a passage unit 4 and actuator units 21. Within the passage unit 4, an ink passage including a plurality of pressure chambers 10 (see FIG. 3) is formed, as will be described later. The actuator units 21 each having a substantially trapezoidal shape are bonded to an upper face of the passage unit 4. The actuator unit 21 can change a volume of a pressure chamber 10, so that ink is ejected from the nozzle 8 (see FIG. 3) which communicates with the pressure chamber 10. A lower face of the passage unit 4 which is opposite to where the actuator unit 21 is bonded, is an ink ejection region where a plurality of nozzles 8 are arranged in a matrix. That is, a plurality of ink ejection regions are formed on the ink ejection face which is the lower face of the passage unit 4.

As shown in FIG. 1, an FPC (Flexible Printed Circuit) 50 is bonded to an upper face of each actuator unit 21, and extends to left or right. The FPC electrically connects the actuator unit 21 to a driver IC 80 which controls driving of the actuator unit 21. A not-shown FFC (Flexible Flat Cable) is bonded to a vicinity of an end of the FPC 50 opposite to its end bonded to the actuator unit 21. The FFC is connected to a relay board which is electrically connected to a controller which controls a whole of an apparatus. Accordingly, a signal from the controller can be transmitted to the driver IC 80.

Further, the base block 71 has ink supply paths 3*b* which communicate with the ink reservoirs 3 and protrude downward, as shown in FIG. 1. On the other hand, openings 4*a* are formed on the upper face of the passage unit 4 as shown in FIG. 2. The openings 4*a* communicate with manifold channels 5 (see FIG. 3) which are formed inside the passage unit 4 as will be described later. The base block 71 is positioned in such a manner that the ink supply paths 3*b* is connected to the openings 4*a* formed on the upper face of the passage unit 4. That is, the base block 71 is, only at lower ends of the ink supply paths 3*b*, in contact with the upper face of the passage unit 4. As a result, a lower face 73 of the base block 71 except the lower ends of the ink supply paths 3*b* is spaced apart from the upper face of the passage unit 4. In a spaced thus formed, the actuator units 21 are disposed.

Figure 3:
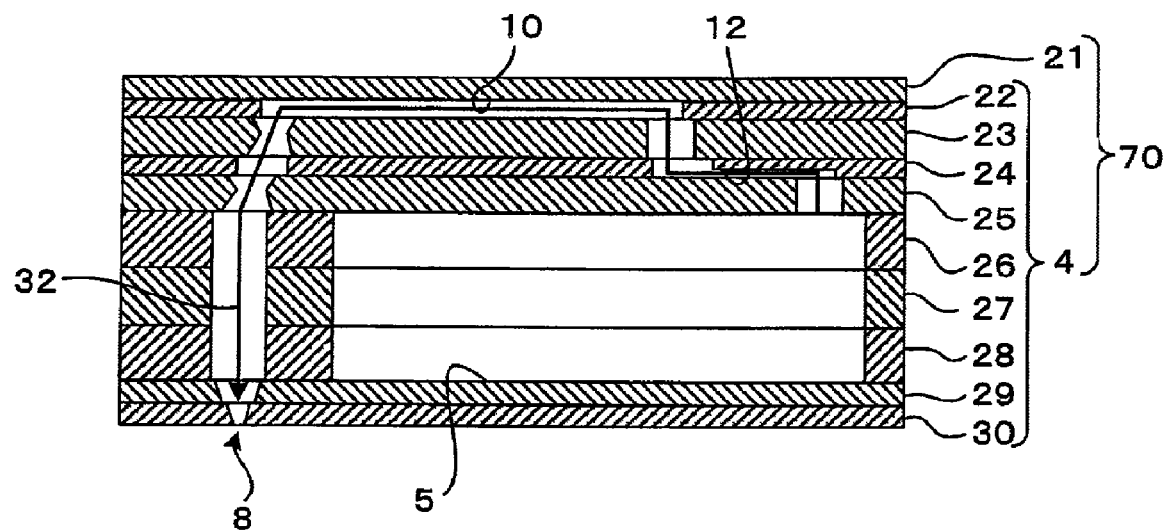
FIG. 3 is a partial sectional view of the head main body shown in FIG. 2.

Next, an internal structure of the head main body 70 will be described. As shown in FIG. 3 which is a partial sectional view of the head main body 70, the head main body 70 has a layered structure of ten plates in total, namely, from a top side, an actuator unit 21, a cavity plate 22, a base plate 23, an aperture plate 24, a supply plate 25, manifold plates 26, 27, and 28, a cover plate 29, and a nozzle plate 30, among which nine plates 22 to 30 other than the actuator unit 21 constitute the passage unit 4.

Any of the nine plates 22 to 30 which constitute the passage unit 4 is a metal plate. The nine plates 22 to 30 are put in layers while being positioned relative to one another in such a manner that later-described individual ink passages 32 are formed within the passage unit 4. Formed in the cavity plate 22 are a plurality of openings which serve as pressure chambers 10 each having a substantially rhombic shape in a plan view as will be described later. In the aperture plate 24, apertures 12 formed by a half etching are formed in one-to-one correspondence with the pressure chambers 10. The manifold plates 26, 27, and 28 extend in the main scanning direction, and formed with a manifold channel 5 which is shared among a plurality of pressure chambers 10. In the nozzle plate 30, nozzles 8 are formed in one-to-one correspondence with the pressure chambers 10. In the base plate 23, the aperture plate 24, and the supply plate 25, communication holes are respectively formed in such a manner that one lengthwise end of each pressure chamber 10 (i.e., a right end in FIG. 3) communicates through an aperture 12 with the manifold channel 5. Further, in the plates 23 to 29 which exist between the pressure chambers 10 and the nozzle 8, through holes each connecting an end (i.e., a left end in FIG. 3) of each pressure chamber 10 opposite to the end thereof communicating with the manifold channel 5 to a corresponding nozzle 8.

As a consequence, within the passage unit 4, individual ink passages 32 each extending from a manifold channel 5 through an aperture 12 and a pressure chamber 10 to a nozzle 8 are formed corresponding to respective pressure chambers 10. The plurality of individual ink passages 32 are formed in a region within the passage unit 4 opposed to each ink ejection region.

Figure 4A:
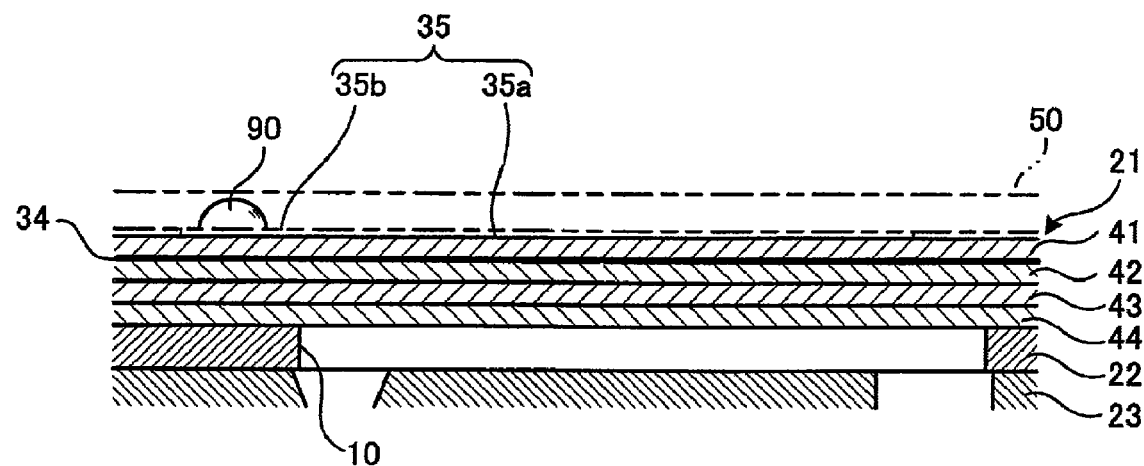
FIG. 4A is a sectional view of an actuator unit shown in FIG. 2.
Figure 4B:
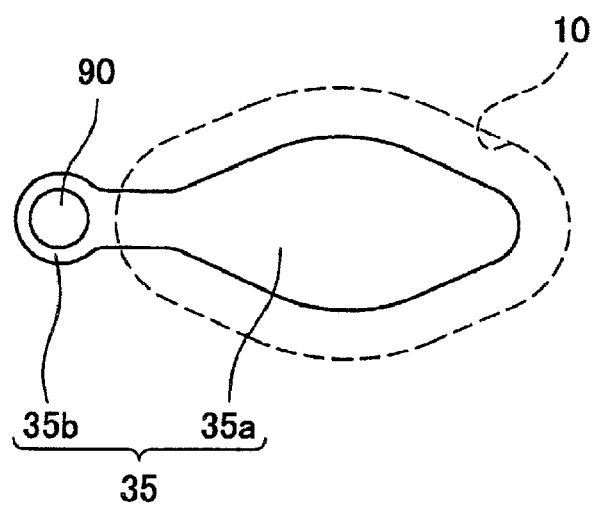
FIG. 4B is a plan view of an individual electrode shown in FIG. 4A.

Next, a description will be given to a construction of the actuator unit 21 which is put on the uppermost cavity plate 22 in the passage unit 4. FIG. 4A is a partial enlarged sectional view of the actuator unit 21 and the pressure chamber 10, and FIG. 4B is a plan view of an individual electrode 35 which is formed on a surface of the actuator unit 21.

As shown in FIG. 4A, the actuator unit 21 has four piezoelectric sheets 41, 42, 43, and 44. The piezoelectric sheets 41 to 44 are made of a lead zirconate titanate (PZT)-base ceramic material having ferroelectricity. Any of the piezoelectric sheets 41 to 44 is disposed so as to extend over a plurality of pressure chambers 10 which are formed in a part of the passage unit 4 opposed to one ink ejection region. Individual electrodes 35 are formed on a surface of the uppermost piezoelectric sheet 41. A common electrode 34 is interposed between the piezoelectric sheet 41 and the piezoelectric sheet 42 disposed under the piezoelectric sheet 41. The common electrode 34 is formed over an entire opposed area between the piezoelectric sheets 41 and 42. Both of the individual electrodes 35 and the common electrode 34 are made of a metal material such as Ag—Pd-based one. The common electrode 34 is kept at the ground potential.

The individual electrode 35 has a main electrode portion 35*a* and a land 35*b*. As shown in FIG. 4B, in a plan view, the main electrode portion 35*a* has a substantially rhombic shape which is slightly smaller than the pressure chamber 10. The main electrode portion 35*a* is formed in a region which overlaps the pressure chamber 10 in a plan view. The land 35*b* has a circular shape in a plan view. One acute portion of the main electrode portion 35*a* of substantially rhombic shape extends to a position not overlapping the pressure chamber 10 in a plan view, and thereby the land 35*b* is formed. A bump 90 which protrudes upward is formed on the land 35*b*. The bump 90 is made of a metal material including Ag, and has conductivity and thermosetting properties. Through the bump 90, a terminal 53 of the FPC 50 (see FIG. 5) is electrically connected to the individual electrode 35, as will be described later. As a result, a potential of each individual electrode 35 can individually be controlled.

Here, an action of the actuator unit 21 will be described. In the actuator unit 21, a portion of the uppermost piezoelectric sheet 41 sandwiched between the common electrode 34 and each individual electrode 35 is an active layer, while the piezoelectric sheets 42 to 44 are inactive layers. The piezoelectric sheet 41 is polarized in its thickness direction. By selectively applying a drive potential to a plurality of individual electrodes 35, an electric field in the thickness direction is applied to an active layer of the piezoelectric sheet 41 corresponding to this individual electrode 35, so that the active layer contracts in a horizontal direction which is perpendicular to a polarization direction, that is, perpendicular to the thickness direction. At this time, along with contraction of the active layer of the piezoelectric sheet 41, the piezoelectric sheets 41 to 44 deform protrudingly toward the inactive layers. As a result, a volume of a pressure chamber 10 opposed to the active layer of the piezoelectric sheet 41 is reduced to apply pressure to ink contained in the pressure chamber 10. Thus, an ink droplet is ejected from a nozzle 8 which communicates with this pressure chamber 10 (see FIG. 3).

Next, a construction of the FPC 50 will be described with reference to FIG. 5 which is a partial enlarged sectional view of the FPC 50, and the lands 35*b* and the bumps 90 of the actuator unit 21.

Figure 5:
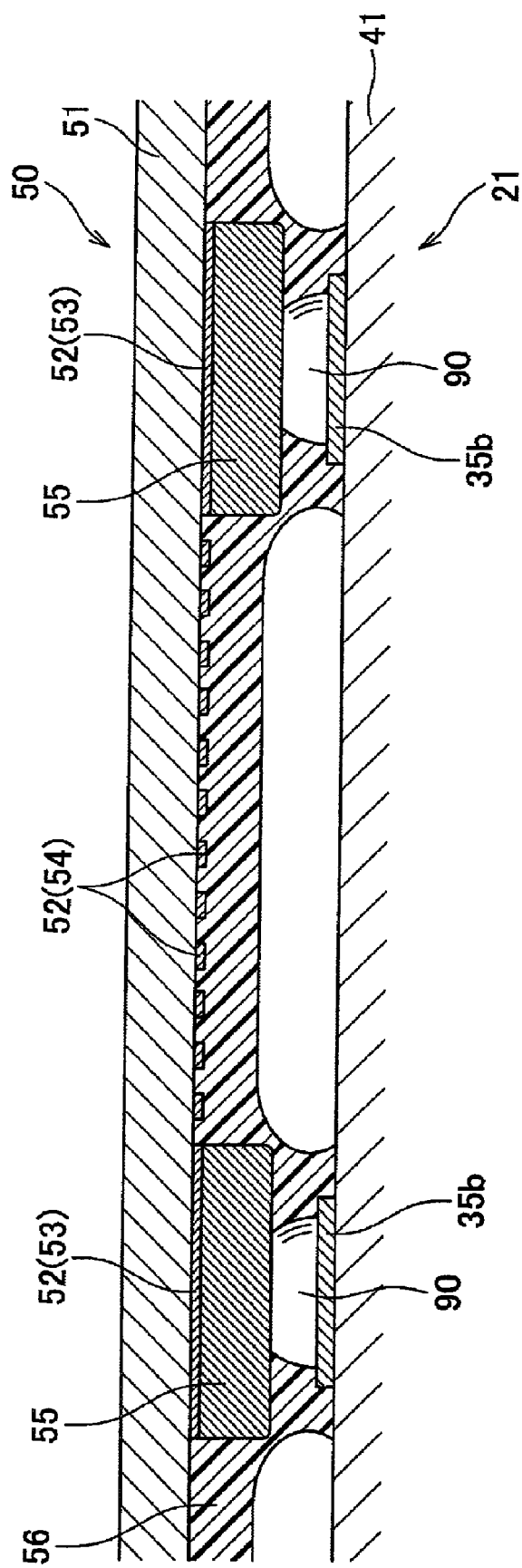
FIG. 5 is an enlarged sectional view of a bonding portion between an FPC and the actuator unit shown in FIG. 1.

As shown in FIG. 5, the FPC 50 has a base material 51 and a plurality of conductors 52. The base material 51 is made of polyimide. The plurality of conductors 52 are formed of a conductive material (copper in this embodiment) on the base material 51 (on a lower side of the base material 51 in FIG. 5). The plurality of conductors 52 constitute a wiring pattern which connects the driver IC 80 and the plurality of individual electrodes 35 to each other. Each of the plurality of terminals 53 provided at distal ends of the respective conductors 52 has, on its surface (i.e., a lower face in FIG. 5), a solder layer 55 which is formed in a later-described heating step.

Further, an electrically insulating synthetic resin layer 56 is formed of a thermosetting resin such as an epoxy resin on the base material 51 (i.e., the lower face in FIG. 5). The synthetic resin layer 56 covers a plurality of conductors 52 and a plurality of solder layers 55. A plurality of bumps 90 which are provided on the lands 35*b* of the individual electrode 35 pass through the synthetic resin layer 56, so that the bumps 90 and the solder layers 55 are in contact with each other. That is, the conductors 52 of the FPC 50 and the individual electrodes 35 are connected to each other through the bumps 90 and the solder layers 55.

Next, a method of manufacturing the ink-jet head 1 will be described. First, the nine plates, namely, the cavity plate 22, the base plate 23, the aperture plate 24, the supply plate 25, the manifold plates 26, 27, and 28, the cover plate 29, and the nozzle plate 30 are put in layers while being positioned in such a manner that individual ink passages 32 are formed therein. Then, the nine plates are bonded with an adhesive. Thereby, the passage unit 4 is prepared.

Then, the actuator unit 21 is prepared. More specifically, first, lead zirconate titanate (PZT)-base ceramic powder, a binder, and a solvent are mixed, and spread on a film of a resin such as PET (polyethylene terephthalate), for being dried. Thereby, a green sheet is prepared. The green sheet prepared at this time is relatively large one so that piezoelectric sheets 41 to 44 for a plurality of actuator units 21 are obtained from one green sheet.

Then, two kinds of such green sheets are prepared. A green sheet of one kind has a common electrode 34 formed on a substantially entire face thereof. This green sheet is baked to turn into the piezoelectric sheet 42. Green sheets of the other kind are green sheets alone, and no electrode is formed thereon. A layered structure of the four green sheets is formed, and degreased and baked, to turn into the piezoelectric sheets 41 to 44. Then, by mask printing, a plurality of pasty individual electrodes 35 are printed on a surface of the piezoelectric sheet 41. After the piezoelectric sheet 41 is baked, bumps 90 are formed on lands 35*b* of the individual electrodes 35, and then dried. The large piezoelectric sheets 41 to 44 thus obtained are cut into trapezoidal shapes as shown in FIG. 2. Thereby, individual actuator units 21 are formed.

Figure 6:
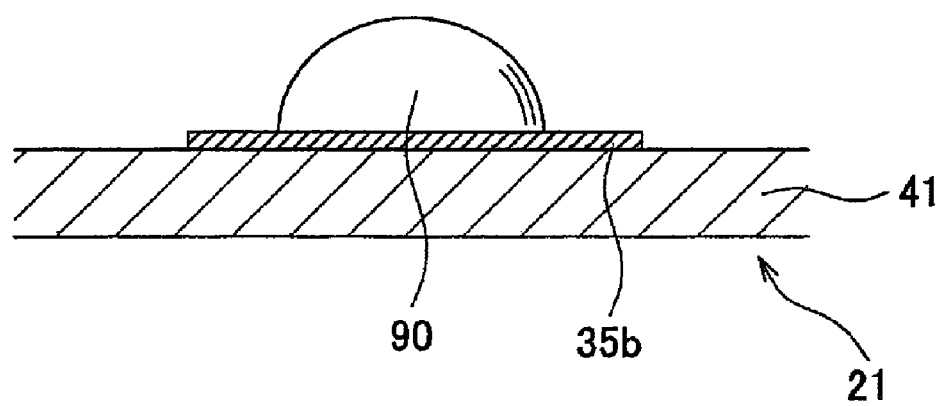
FIG. 6 shows a state after a bump forming step during a manufacture process of the ink-jet head shown in FIG. 1.

The bumps 90 are formed by use of a mask. The mask has a plurality of circular openings each corresponding to each land 35*b*. The opening is slightly smaller than the land 35*b*. Through the openings, a thermosetting silver paste is applied. In this way, as shown in FIG. 6, substantially hemispherical bumps 90 are formed on respective surfaces of the plurality of lands 35*b* (bump forming step). In this embodiment, a height of the bump 90 is approximately 35 μm. At this stage, the bump 90 is a dried silver paste, and not completely cured. Then, an adhesive is applied to a surface of the passage unit 4 (and more specifically the cavity plate 22), and the actuator unit 21 is bonded to the passage unit 4.

Figure 8A:
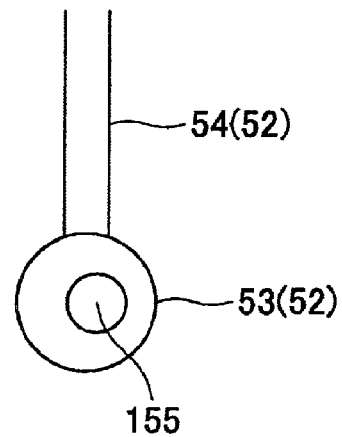
FIG. 8A is a plan view of a conductor of the FPC during the manufacture process of the ink-jet head shown in FIG. 1, showing a state after the solder paste application step.
Figure 8B:
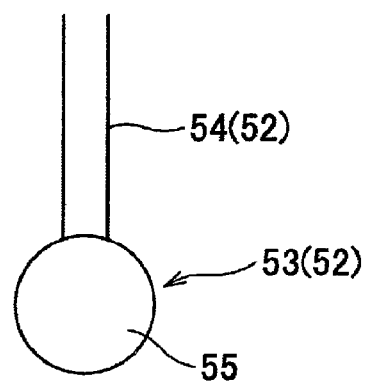
FIG. 8B is a plan view of the conductor of the FPC during the manufacture process of the ink-jet head shown in FIG. 1, showing a state after a heating step.
Figure 8C:
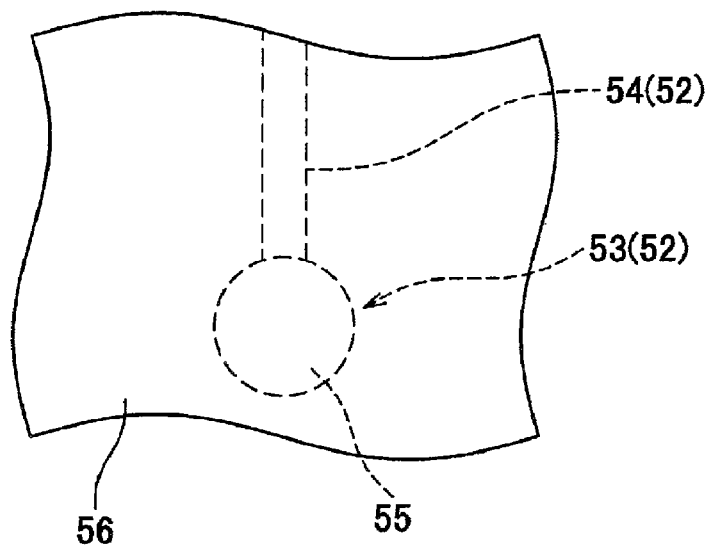
FIG. 8C is a plan view of the conductor of the FPC during the manufacture process of the ink-jet head shown in FIG. 1, showing a state after a covering step.
Figure 9A:
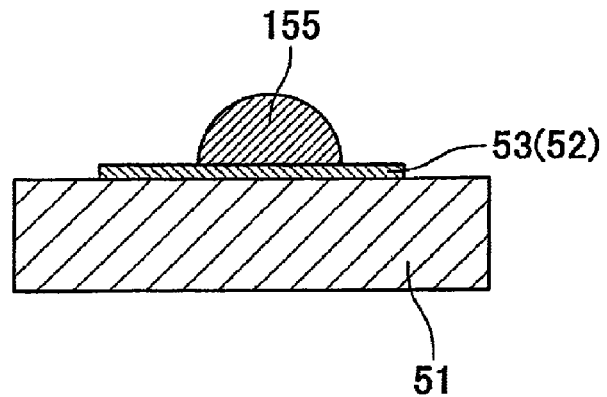
FIG. 9A is a sectional view of the FPC during the manufacture process of the ink-jet head shown in FIG. 1, showing a state after the solder paste application step.

On the other hand, as shown in FIG. 7, using a metal mask 160, a solder paste body 155 is applied to a surface of the FPC 50 in which a plurality of conductors 52 of approximately 8 μm thickness are formed on a base material 51 of approximately 40 μm thickness. The metal mask 160 has a plurality of circular openings 161 which correspond to a plurality of terminals 53 of the plurality of conductors 52. The circular opening 161 is sufficiently smaller than the terminal 53 which has a circular shape in a plan view (see FIG. 8). In this embodiment, a diameter of the opening 161 is approximately not more than half a diameter of the terminal 53. To be more specific, first, the metal mask 160 and the FPC 50 are positioned relative to each other in such a manner that the plurality of openings 161 of the metal mask 160 are opposed to the respective terminals 53, as shown in FIG. 7A. Then, a semi-solid solder paste 150 which is disposed on an upper face of the metal mask 160 is spread by a squeegee 165 to fall into the opening 161, as shown in FIG. 7B. In this way, as shown in FIGS. 8A and 9A, the solder paste bodies 155 is applied onto the plurality of terminals 53 of the plurality of conductors 52 (solder paste application step) in a partial manner.

In this embodiment, the solder paste 150 applied in the solder paste application step, that is, the solder paste body 155, includes tin as a base, and also includes silver, copper, and in addition an organic substance such as rosin, and a melting point of the solder paste body 155 is approximately 220 degrees C. To be more specific, components of the solder paste 150 are 80 to 90 wt % of tin, 1 to 4 wt % of silver, not more than 1 wt % of copper, 2 to 4 wt % of diethylene glycol monohexyl ether, not more than 1 wt % of 2-ethyl-1,3-hexanediol, and 4 to 6 wt % of rosin.

Figure 9B:
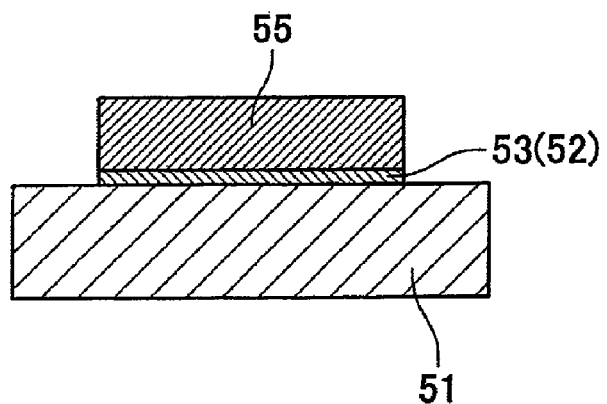
FIG. 9B is a sectional view of the FPC during the manufacture process of the ink-jet head shown in FIG. 1, showing a state after the heating step.

Subsequently, the FPC 50 having the solder paste bodies 155 applied onto the terminals 53 (see FIGS. 8A and 9A) is heated, so that the solder paste bodies 155 reflow. To be more specific, first, the FPC 50 is preheated up to a certain temperature, and then heated for a short time at a high temperature equal to or higher than the melting point of the solder paste body 155. In this embodiment, heating is performed for one to two minutes at a temperature of approximately 380 to 400 degrees C. As a consequence, the solder paste body 155 is melted, and further a volatile component evaporates. Due to surface tension, the solder paste body 155 spreads uniformly over the terminal 53. Thus, a solder layer 55 having a thickness of approximately 40 μm is formed as shown in FIGS. 8B and 9B. At this time, the melted solder paste body 155 spreads over an entire region on the terminal 53. That is, the solder layer 55 which covers a whole of the terminal 53 is formed (heating step).

Figure 9C:
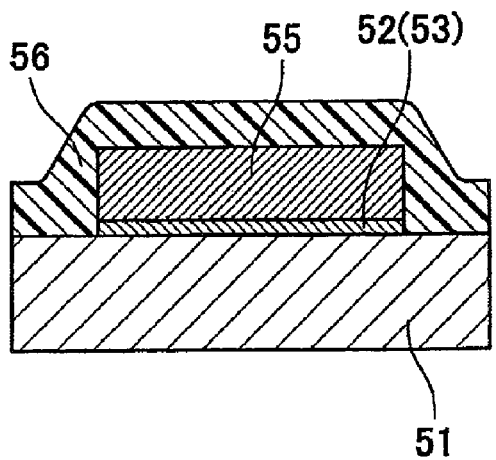
FIG. 9C is a sectional view of the FPC during the manufacture process of the ink-jet head shown in FIG. 1, showing a state after the covering step.

Then, by mask printing, an uncured thermosetting resin is applied to a region of the surface of the FPC 50 where a plurality of terminals 53 are formed. Thus, an uncured synthetic resin layer 56 of approximately 25 μm thickness, which covers a plurality of terminals 53 and a plurality of solder layers 55, is formed as shown in FIGS. 8C and 9C (covering step). The region where the plurality of terminals 53 are formed has a substantially trapezoidal shape so as to correspond to an outer shape of the actuator unit 21. Accordingly, a region where the synthetic resin layer 56 is formed has a trapezoidal shape, too, in which all terminals 53 are contained. At this time, by properly adjusting conditions such as a temperature, the synthetic resin layer 56 is kept in an uncured (half-cured) state so as not to drop down from the FPC 50.

Figure 10A:
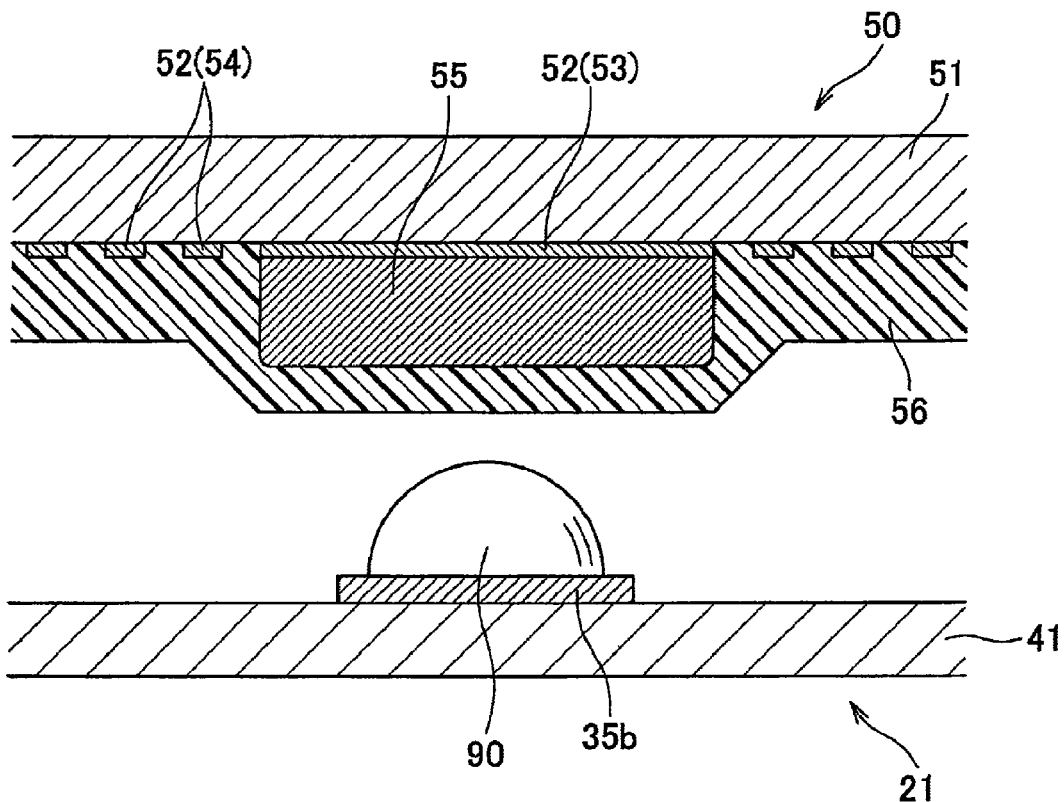
FIG. 10A shows a state where the actuator unit and the FPC are being positioned relative to each other in a contact step during the manufacture process of the ink-jet head shown in FIG. 1.
Figure 10B:
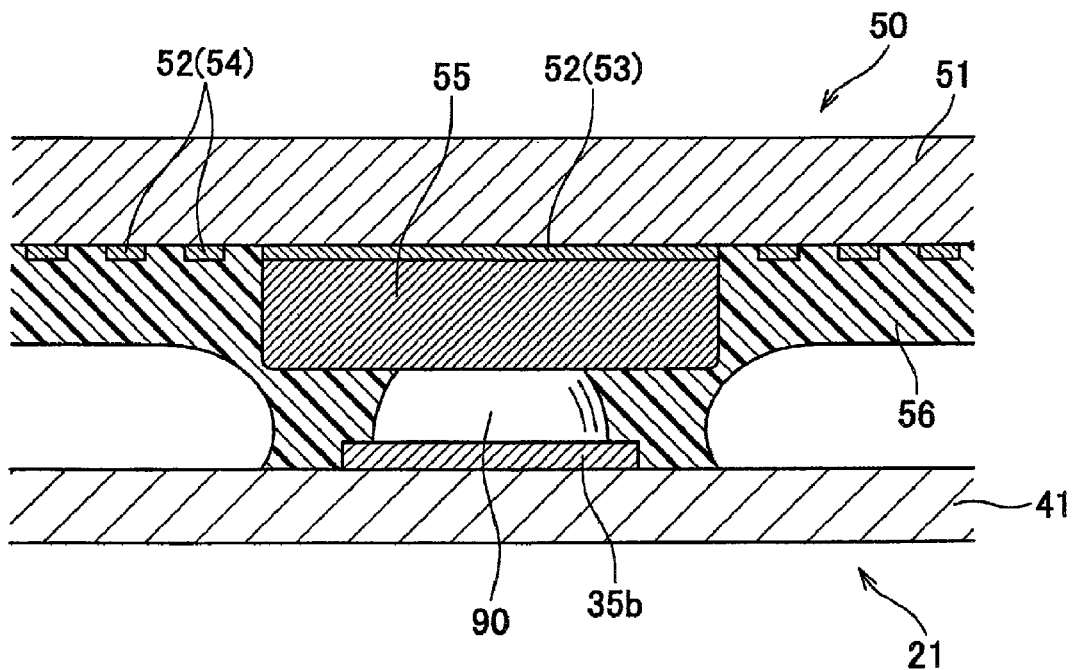
FIG. 10B shows a state where the actuator unit and the FPC are pressed to each other in the contact step during the manufacture process of the ink-jet head shown in FIG. 1.

Then, as shown in FIG. 10A, regions of the uncured synthetic resin layer 56 covering the respective solder layers 55 and the bumps 90 are pressed to each other, in a state where the actuator unit 21 and the FPC 50 are positioned relative to each other in such a manner that the bumps 90 and the solder layers 55 are opposed to each other. By deforming the synthetic resin layer 56 so as to make the bumps 90 pass through the synthetic resin layer 56, the plurality of bumps 90 and the plurality of solder layers 55 are brought into contact with each other as shown in FIG. 10B (contact step).

If the synthetic resin layer 56 comes into contact with portions of the piezoelectric sheet 41 opposed to the respective pressure chambers 10 in the contact step and is cured in a later-described curing step, deformation of the piezoelectric sheets 41 to 44 is hindered. Therefore, it is preferable that the bump 90 is high to a certain extent, in order to prevent the synthetic resin layer 56 from coming into contact with the piezoelectric sheet 41. In this embodiment, a height of the bump 90 is approximately 35 μm. However, making bumps 90 higher tends to cause variation in height among a plurality of bumps 90. In the contact step, therefore, pressing load on the FPC 50 and the actuator unit 21 is made higher, to crush the bumps 90 which are not yet completely cured as shown in FIG. 10B. As a result, heights of the bumps 90 are uniformized, to surely bring all the bumps 90 and the terminals 53 into contact with each other. At this time, the hard solder layers 55 function as a highly rigid supporter. Accordingly, even though the FPC 50 has flexibility, the applied load concentrates on the solder layers 55. Therefore, the bumps 90 can be crushed well.

Finally, heating is performed at 180 degrees C., thereby curing the synthetic resin layer 56 and the bumps 90 (curing step). Thus, the bumps 90 and the solder layers 55 are bonded to each other. Here, as shown in FIG. 10B, in a connecting portion between the bump 90 and the solder layer 55, the synthetic resin layer 56 completely covers a surface of the bump 90 and reaches the surface of the actuator unit 21 and more specifically reaches an upper side of the land 35b. That is, the synthetic resin layer 56 is formed so as to extend to the FPC 50 and the actuator unit 21. This strengthens the connecting portion between the bump 90 and the solder layer 55. In this embodiment, the synthetic resin layer 56 does not reach portions of the piezoelectric sheet 41 opposed to the pressure chambers 10, and therefore deformation of the piezoelectric sheets 41 to 44 is not hindered.

As thus far described above, in this embodiment, the bump forming step is firstly performed. In the bump forming step, conductive bumps 90 to be electrically connected to the individual electrodes 35 are formed on a plurality of lands 35b of the actuator unit 21. Then, the solder paste application step is performed. In the solder paste application step, the solder paste bodies 155 are partially applied onto the respective terminals 53 by use of the metal mask 160 having a plurality of openings 161 which correspond to the plurality of terminals 53. A diameter of the opening 161 is sufficiently smaller than a diameter of the terminal 53. Further, the heating step, the covering step, the contact step, and the curing step are performed. In the heating step, the respective solder paste bodies 155 are reflown to form a plurality of solder layers 55 on the plurality of terminals 53. In the covering step, the plurality of terminals 53 and the plurality of solder layers 55 are covered by the uncured synthetic resin layer 56. In the contact step, regions of the synthetic resin layer 56 covering the respective solder layers 55 and the bumps 90 are pressed to each other, to bring the plurality of bumps 90 and the plurality of solder layers 55 into contact with each other. In the curing step, the uncured synthetic resin layer 56 is cured. Accordingly, a relatively high degree of freedom is given to positioning between the openings 161 of the metal mask 160 and the terminals 53 in the solder paste application step. In addition, high accuracy is not required when forming the openings 161 in the metal mask 160 so as to correspond to the plurality of terminals 53. Therefore, the ink-jet head 1 can be manufactured at low costs, in which the solder layers 55 functioning as a supporter for the FPC 50 in the contact step are formed and therefore the actuator unit 21 and the FPC 50 can be properly bonded to each other.

In this embodiment, the solder layer 55 which covers a whole of the terminal 53 is formed in the heating step. Accordingly, it is not necessary to demand very high accuracy as accuracy of positioning between the bumps 90 and the solder layers 55 in the contact step. This can further suppress manufacture costs of the ink-jet head 1.

In this embodiment, further, the ink-jet head 1 includes the passage unit 4 which has a plurality of pressure chambers 10 and the manifold channel 5. The plurality of pressure chambers 10 communicate with nozzles 8 which eject ink. The manifold channel 5 communicates with the plurality of pressure chambers 10. Moreover, the actuator unit 21 has the piezoelectric sheets 41 to 44 which are provided on the surface of the passage unit 4, and the plurality of individual electrodes 35 which are formed on the surface of the piezoelectric sheet 41 so as to correspond to the plurality of pressure chambers 10, respectively. The individual electrode 35 has a main electrode portion 35a which is formed in a region overlapping a pressure chamber 10 in a plan view, and a land 35b which extends out from the main electrode portion 35a to a region not overlapping the pressure chamber 10. In the bump forming step, the bump 90 is formed on a surface of the land 35b.

Since the bump 90 is formed on the land 35b which extends out to the region not overlapping the pressure chamber 10, the bump 90 does not hinder deformation of a portion of the piezoelectric sheets 41 to 44 opposed to the pressure chamber 10. In addition, even when, in the contact step, the synthetic resin layer 56 adheres to the piezoelectric sheet 41 around the land 35b, deformation of the portion of the piezoelectric sheets 41 to 44 opposed to the pressure chamber 10 is not hindered. This allows ink to be ejected in a stable manner. Further, load applied in this step is supported not only by the piezoelectric sheets 41 to 44 but also by the passage unit 4 which exists under the piezoelectric sheets 41 to 44. Accordingly, when bonding the bump 90 and the solder layer 55 to each other, the piezoelectric sheets 41 to 44 are not damaged due to the load.

In this embodiment, in addition, the solder layer 55 is formed on the terminal 53. Accordingly, a gap between the synthetic resin layer 56 of the FPC 50 and the piezoelectric sheet 41 of the actuator unit 21 can be enlarged by a thickness of the solder layer 55. Therefore, it can be more surely prevented that the synthetic resin layer 56 adheres to a portion of the piezoelectric sheet 41 opposed to the pressure chamber 10 in the contact step and then the synthetic resin layer 56 is cured in the curing step to hinder deformation of the piezoelectric sheets 41 to 44.

Figure 11:
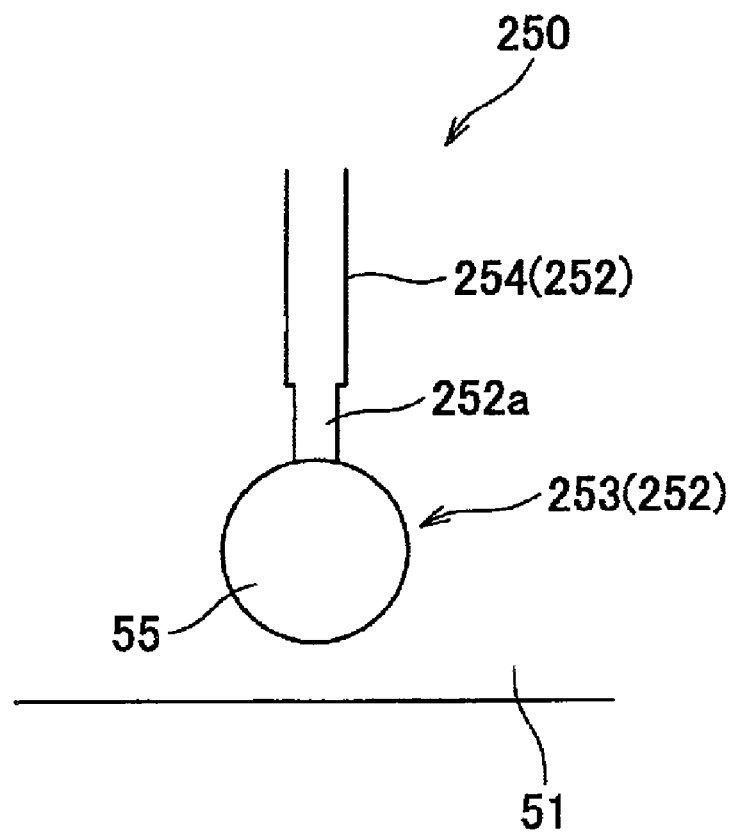
FIG. 11 shows a modification of the first embodiment of the invention, and is an enlarged plan view of a part of an FPC.

Next, a modification of the above-described embodiment will be described with reference to FIG. 11. This modification makes a change to the above-described embodiment, only in the construction of the conductor 52 of the FPC 50. FIG. 11 is an enlarged plan view in the vicinity of a terminal 253 provided at a distal end of each of a plurality of conductors 252 which are formed on a base material 51 of an FPC 250 of this modification.

As shown in FIG. 11, in the FPC 250 of this modification, the terminal 253 provided at the distal end of the conductor 252 is connected to a remaining portion 254 of the conductor 252 through a neck portion 252a which has a width smaller than widths of the terminal 253 and the remaining portion 254, that is, lengths thereof extending along a horizontal direction in FIG. 11. The neck portion 252a makes it difficult for a solder paste body 155 melted by heating in the heating step to flow out to the remaining portion 254 of the conductor 252. It is therefore possible to form a relatively thick solder layer 55 on the terminal 253. As a result, a function of the solder layer 55 as a supporter for the FPC 250 can be enhanced, and in addition a gap between the FPC 250 and the actuator unit 21 can be enlarged to further surely prevent the FPC 250 and the actuator unit 21 from being in contact with each other.

Second Embodiment

Figure 12:
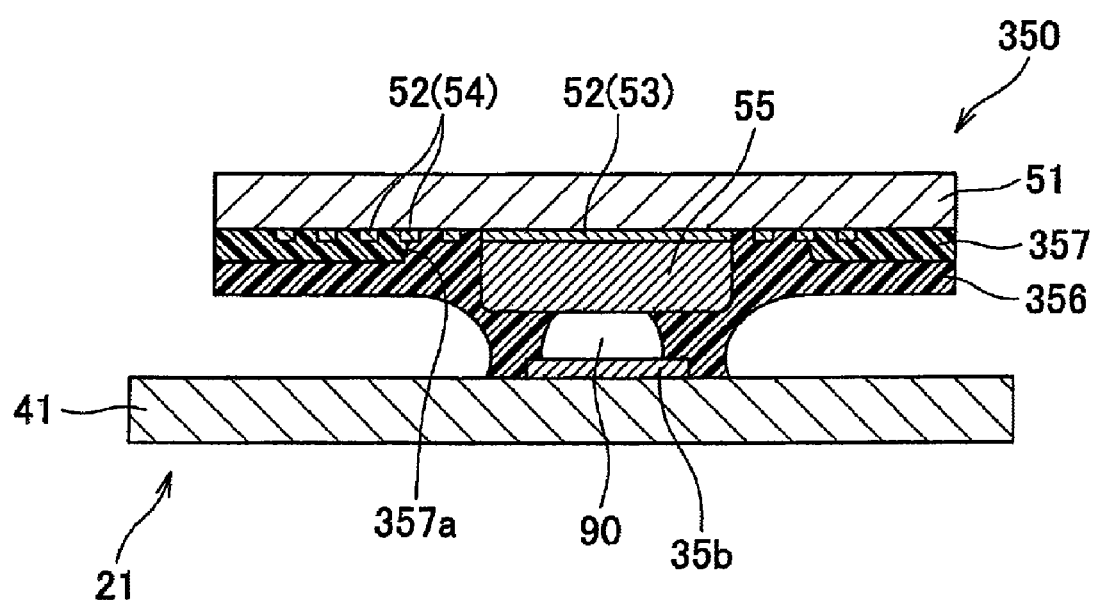
FIG. 12 is an enlarged view of a bonding portion between an FPC and an actuator unit according to a second embodiment of the present invention.
Figure 13A:
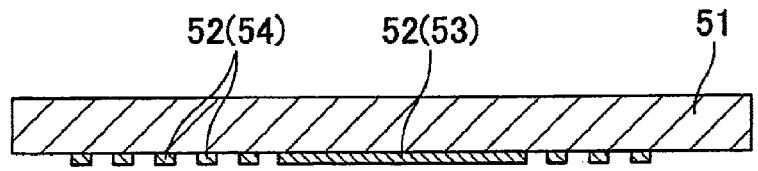
FIG. 13A is a sectional view during a manufacture process of the FPC shown in FIG. 12, showing a state before a precovering step.
Figure 13B:
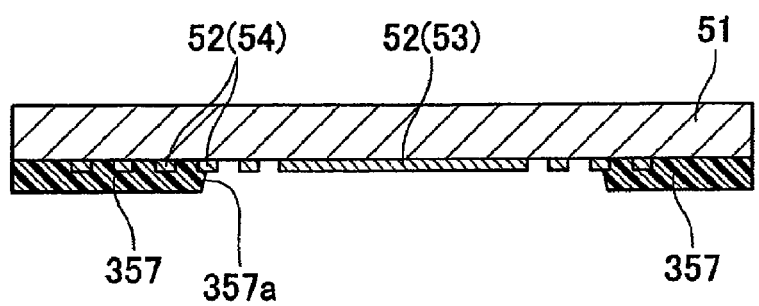
FIG. 13B is a sectional view during the manufacture process of the FPC shown in FIG. 12, showing a state before a precovering step.
Figure 13C:
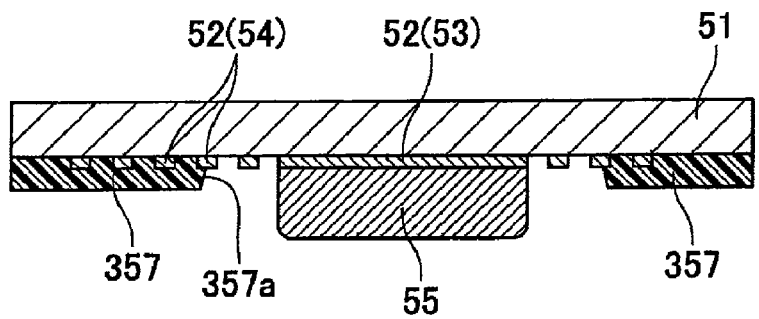
FIG. 13C is a sectional view during the manufacture process of the FPC shown in FIG. 12, showing a state after a heating step.
Figure 13D:
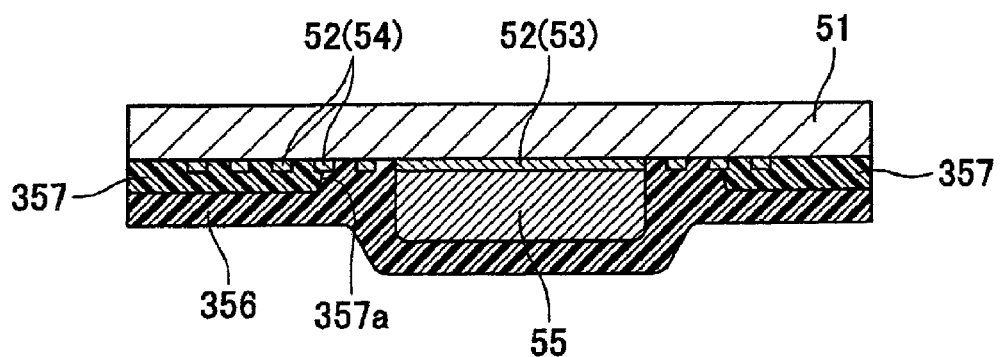
FIG. 13D is a sectional view during the manufacture process of the FPC shown in FIG. 12, showing a state after a covering step.
Figure 14:
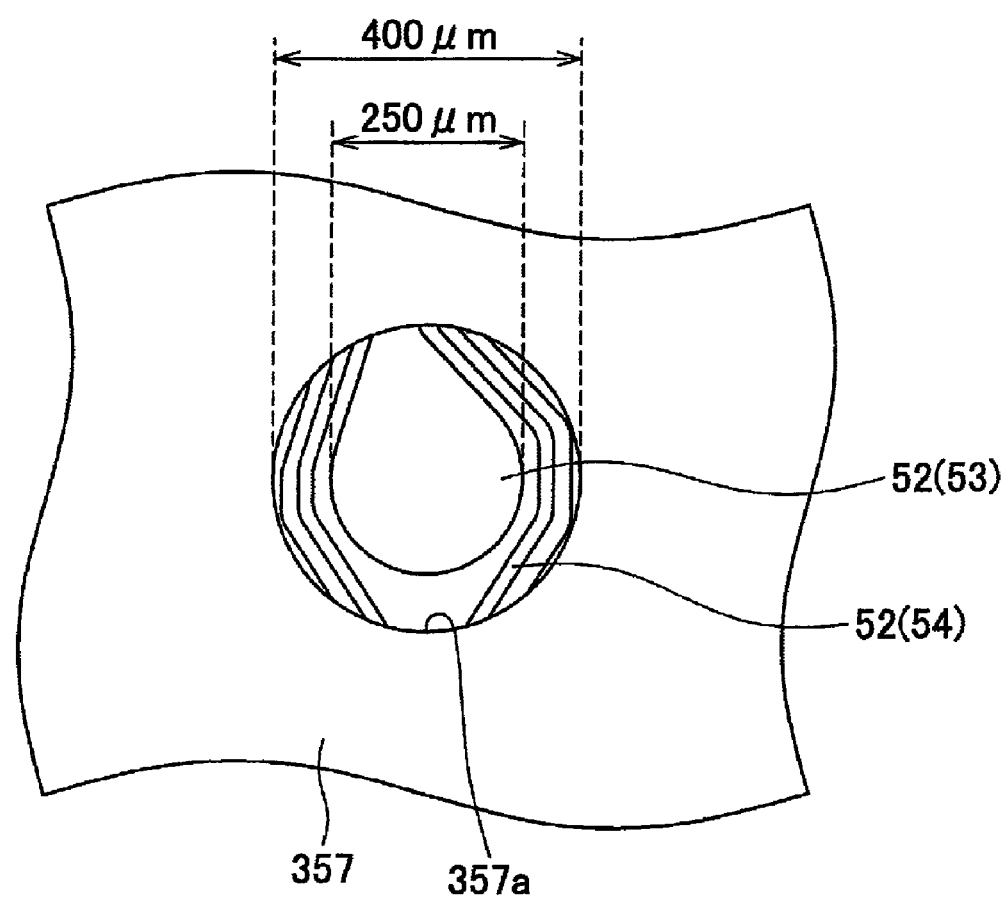
FIG. 14 is a plan view of the FPC during the manufacture process shown in FIG. 13B.

Next, a second embodiment of the present invention will be described with reference to FIGS. 12 to 14. FIG. 12 is an enlarged sectional view of a connecting portion of the FPC and the actuator unit of this embodiment. FIG. 13 is a sectional view during a manufacture process of the FPC shown in FIG. 12. FIG. 14 is a plan view of the FPC during the manufacture process shown in FIG. 13B. Except for a construction of an FPC 350, this embodiment is the same as the first embodiment. In the following, therefore, a description will be given only to a construction of an FPC 350 and a method for manufacturing the FPC 350.

The FPC 350 of the second embodiment and the FPC 50 of the first embodiment differ mainly in that the FPC 350 of this embodiment is formed with synthetic resin layers 356 and 357 which are two layers while the FPC 50 is formed with only the synthetic resin layer 56 which is one layer. In the following, the same constructions as those of the first embodiment will be denoted by the common reference numerals, and their descriptions will appropriately be omitted.

In the FPC 350 of this embodiment, as shown in FIG. 12, a first synthetic resin layer 357 is formed on a base material 51 (i.e., a lower face in FIG. 12) on which conductors 52 are formed. The first synthetic resin layer 357 has a plurality of openings 357a through which a plurality of terminals 53 provided at distal ends of the conductors 52 are individually exposed. A solder layer 55 is formed on a surface of the terminal 53 which is exposed through the first synthetic resin layer 357. Further, a second synthetic resin layer 356 is formed on the base material 51. The second synthetic resin layer 356 covers the first synthetic resin layer 357 and the openings 357a formed in the first synthetic resin layer 357. A plurality of bumps 90 which are provided on lands 35b of individual electrodes 35 pass through the second synthetic resin layer 356, so that the bumps 90 and the solder layers 55 are in contact with each other.

The second synthetic resin layer 356 is formed so as to extend to the FPC 350 and a piezoelectric sheet 41 of an actuator unit 21. In this embodiment, the second synthetic resin layer 356 covers a periphery of a contact portion between the solder layer 55 and the bump 90, over a whole circumference thereof. By the bump 90 and the solder layer 55 being in contact with each other, the FPC 350 and the actuator unit 21 are electrically connected to each other. In addition, by the second synthetic resin layer 356 adhering to the surface of the piezoelectric sheet 41 so as to cover a contact portion between the bump 90 and the solder layer 55, the FPC 350 and the actuator unit 21 are mechanically connected to each other. Thus, like in the first embodiment, the contact portion is covered by the second synthetic resin layer 356 so that electrical contact between the solder layer 55 and the bump 90 is kept.

Next, a method of manufacturing the FPC 350 of this embodiment will be described. First, as shown in FIG. 13A, the first synthetic resin layer 357 as shown in FIG. 13B is formed on a surface of the FPC 350 in which a plurality of conductors 52 of approximately 8 μm thickness are formed on a base material 51 of approximately 40 μm thickness. The first synthetic resin layer 357 is formed by mask printing in such a manner that the terminals 53 are exposed. At this time, a thickness of the first synthetic resin layer 357 is approximately 25 μm. The first synthetic resin layer 357 is cured after printing (precovering step). In this state, the FPC 350 is conveyed, and sometimes may be stocked for a relatively long period.

Here, as shown in FIG. 14, the terminal 53 has a substantially circular shape having a diameter of approximately 250 μm. The opening 357a which is formed in the first synthetic resin layer 357 so as to expose the terminal 53 has a circular shape having a diameter of approximately 400 μm. Like this, in this embodiment, the diameter of the opening 357a is approximately 1.6 times greater than the diameter of the terminal 53. Therefore, high printing accuracy is not required when forming the first synthetic layer 357. In addition, since the opening 357a is relatively larger than the terminal 53, the remaining portion 54 of the conductor 52 which locates near the terminal 53 is also exposed through the first synthetic resin layer 357 as shown in FIG. 14. However, a large part of the conductor 52 is covered by the first synthetic resin layer 357. In order to prevent corrosion and the like, a portion of the conductor 52 exposed through the first synthetic resin layer 357 may be treated with tin plating, solder plating, or the like.

Then, like in the first embodiment, a solder paste application step and a heating step are performed. In the solder paste application step, solder paste bodies 155 are partially applied onto a plurality of terminals 53. In the heating step, the solder paste bodies 155 are reflown by heating. As a result, a solder layer 55 which has a thickness of approximately 40 μm and covers a whole of the terminal 53 is formed as shown in FIG. 13C. Further, an uncured, second synthetic resin layer 356 having a thickness of approximately 25 μm is formed on a substantially trapezoidal region, which contains all the terminals 53, of the surface of the FPC 350 formed with the first synthetic resin layer 357, in order that the second synthetic resin layer 356 covers a plurality of terminals 53 and a plurality of solder layers 55, as shown in FIG. 13D (covering step). Like the first synthetic resin layer 357, the second synthetic resin layer 356 is formed by mask printing and then dried. Subsequently, like in the first embodiment, the plurality of solder layers 55 covered by the half-cured synthetic resin layer 356 are brought into contact with the plurality of bumps 90 of the actuator unit 21 (contact step), and further bonded to the bumps 90 by the second synthetic resin layer 356 being cured (curing step). In the contact step, the bumps 90 pass through the second synthetic resin layer 356, and are electrically connected to the solder layers 55. In the curing step, the actuator unit 21 is mechanically bonded to the FPC 350 by the cured second synthetic resin layer 356.

As thus far described above, in this embodiment, like in the first embodiment, the ink-jet head 1 can be manufactured at low costs, in which the actuator unit 21 and the FPC 350 can be properly bonded to each other.

In this embodiment, in addition, the precovering step is performed before the solder paste application step. In the precovering step, the first synthetic resin layer 357 which is in a cured state is formed so as to cover the conductors 52. The first synthetic resin layer 357 has the openings 357a through which the plurality of terminals 53 disposed at distal ends of the plurality of conductors 52 are exposed. Accordingly, the first synthetic resin layer 357 can protect a large part of the conductor 52 while allowing the solder paste body 155 to be applied to the surface of the terminal 53 in the solder paste application step and the solder layer 55 to be formed in the heating step. Therefore, adhering of foreign materials to the conductor 52, which causes a short circuit, can be suppressed.

In this embodiment, further, the half-cured second synthetic resin layer 356 is formed on the substantially trapezoidal region, which contains all the terminals 53, of the surface of the FPC 350 formed with the first synthetic resin layer 357.

Accordingly, it is easier to cover the plurality of terminals 53 and the plurality of solder layers 55 than when, for example, the plurality of openings 357a are respectively covered by the second synthetic resin layer 356 by use of a mask or the like having a fine mask pattern which corresponds to the plurality of openings 357a.

Figure 15:
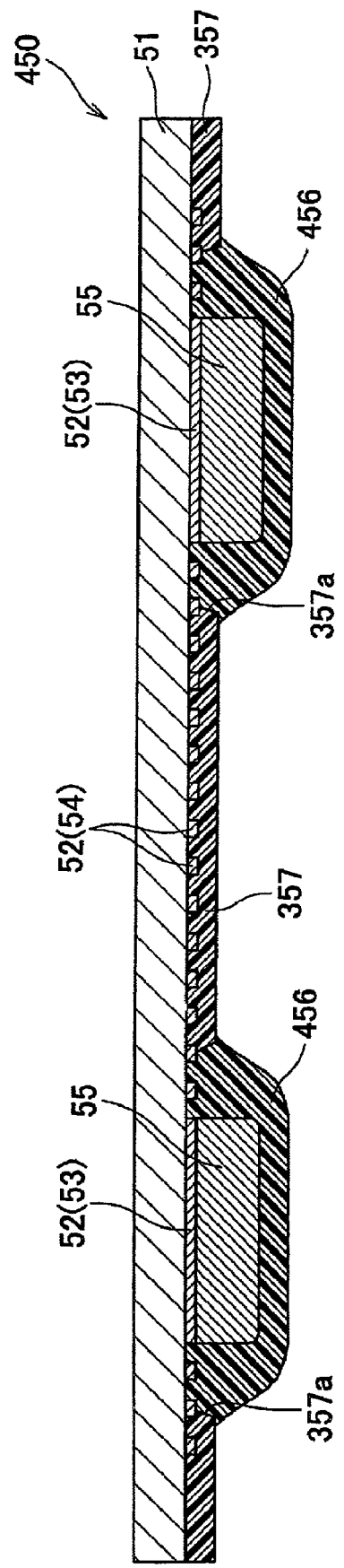
FIG. 15 shows a modification of the second embodiment of the invention, and is a sectional view of an FPC.

Next, a modification of the above-described second embodiment will be described with reference to FIG. 15. This modification makes a change to the above-described second embodiment, only in the construction of the second synthetic resin layer 356. FIG. 15 is a sectional view of an FPC of this modification. As shown in FIG. 15, a second synthetic resin layer 456 of this modification individually covers each of a plurality of openings 357a which are formed in the first synthetic resin layer 357, thereby covering a plurality of terminals 53 and a plurality of solder layers 55. That is, the second synthetic resin layer 456 is formed for each of the plurality of terminals 53. An edge portion of the second synthetic resin layer 456 overlaps an edge portion of each opening 357a of the first synthetic resin layer 357. That is, regions existing between the openings 357a, that is, almost the entire region of the first synthetic resin layer 357 is not covered by the second synthetic resin layer 456.

Accordingly, as compared with when a region of the surface of the FPC 450 except the openings 357a of the first synthetic resin layer 357 is covered by the second synthetic resin layer 456, a gap between the FPC 450 and the actuator unit 21 can be made larger to further surely prevent the FPC 450 and the actuator unit 21 from being in contact with each other.

In the above-described first and second embodiments and modifications thereof, the solder layer 55 which covers a whole of the terminal 53 is formed in the heating step. However, the solder layer 55 may not necessarily cover a whole of the terminal 53 (253).

In the above-described embodiment, the bump 90 is formed on the land 35b which extends out to a region of the individual electrode 35 not overlapping the pressure chamber 10, and the bump 90 and the solder layer 55 of the FPC 50 are brought into contact with each other. However, this is not limitative. The bump 90 may be formed on a region of the individual electrode 35 overlapping the pressure chamber 10. In such a case, it is preferable that an overhang portion is formed inside the pressure chamber and the bump 90 is disposed above the overhang portion. The overhang portion is formed by an upper face of the cavity plate 22 facing the actuator unit 21 which partially protrudes out toward the inside of the pressure chamber 10. Load applied in the contact step is supported by the overhang portion. Therefore, damage to the piezoelectric sheets 41 to 44 can be prevented. In this embodiment, the pressure chamber 10 has a substantially rhombic shape. Therefore, in order not to disturb deformation of the piezoelectric sheets 41 to 44, the overhang portion is preferably formed at an acute-angled portion of the rhombic shape.

In the above-described embodiment, the solder paste body 155 which includes tin as a base and also includes silver, copper, diethylene glycol monohexyl ether, 2-ethyl-1,3-hexanediol, and rosin is applied to the terminal 53 (253). However, components of the solder paste body 155, and contents thereof may be changed appropriately.

In the above-described embodiment, the present invention is applied to the ink-jet head 1 as an example. However, the present invention is also applicable to, for example, a recording head such as a dot printer.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A method of manufacturing a recording head which includes an actuator unit having a plurality of individual electrodes corresponding to a plurality of recording elements, and a flexible printed circuit board which supplies to the individual electrodes a signal for driving the recording elements, the method comprising:
  a bump forming step to form, on a surface of the actuator unit, a plurality of conductive bumps each electrically connected to each of the plurality of individual electrodes;
  a solder paste application step to partially apply solder paste bodies onto a plurality of terminals of a wiring which is formed on the printed circuit board;
  a heating step to heat each of the plurality of solder paste bodies applied onto the plurality of terminals, to thereby form a plurality of solder layers on the plurality of terminals;
  a covering step to cover the plurality of terminals and the plurality of solder layers by an uncured synthetic resin layer;
  a contact step to contact the plurality of bumps and the plurality of solder layers with each other, by pressing regions of the synthetic resin layer covering the solder layers and the bumps to each other thereby deforming the synthetic resin layer; and
  a curing step to cure the uncured synthetic resin layer.

2. The method according to claim 1, wherein the terminal and a remaining portion of the wiring are connected to each other through a neck region which has a width smaller than widths of the terminal and the remaining portion.

3. The method according to claim 1, wherein, in the heating step, the solder layer which covers a whole of the terminal is formed.

4. The method according to claim 1, wherein:
  the recording head is an ink-jet head including a passage unit which has a plurality of pressure chambers communicating with nozzles for ejecting ink and a common ink chamber communicating with the plurality of pressure chambers;
  the actuator unit includes a piezoelectric sheet which is provided on a surface of the passage unit and changes a volume of the pressure chamber, and a plurality of individual electrodes which are formed on a surface of the piezoelectric sheet so as to correspond to the plurality of pressure chambers, respectively;
  the individual electrode includes a main electrode portion which is formed in a region of the surface of the piezoelectric sheet overlapping the pressure chamber when seen in a direction perpendicular to the piezoelectric sheet, and a land which extends from the main electrode portion to a region not overlapping the pressure chamber when seen in the direction perpendicular to the piezoelectric sheet; and
  in the bump forming step, the bump is formed on a surface of the land.

5. The method according to claim 1, further comprising, before the solder paste application step, a precovering step to form a synthetic resin layer which is in a cured state and covers a face of the printed circuit board where the wiring is formed, the synthetic resin layer having a plurality of openings which are larger than the terminals and through which the plurality of terminals are individually exposed.

6. The method according to claim 5, wherein, in the covering step, the plurality of openings of the synthetic resin layer formed in the precovering step are covered by the synthetic resin layer which is in an uncured state.

7. The method according to claim 5, wherein, in the covering step, a region of the synthetic resin layer formed in the precovering step which contains the plurality of openings is covered by the synthetic resin layer which is in an uncured state.

8. A recording head which includes an actuator unit having a plurality of individual electrodes corresponding to a plurality of recording elements, and a flexible printed circuit board which supplies to the individual electrodes a signal for driving the recording elements, wherein:

the actuator unit has a plurality of conductive bumps which are formed on a surface of the actuator unit and electrically connected to the plurality of individual electrodes, respectively;

the printed circuit board includes a wiring including a plurality of terminals, a first synthetic resin layer which covers the wiring and has a plurality of openings which are larger than the terminals and through which the plurality of terminals are individually exposed, solder layers which are formed by partially applying solder paste bodies onto the plurality of terminals and then heating the solder paste bodies, and a second synthetic resin layer which covers at least the plurality of openings; and regions of the second synthetic resin layer covering the solder layers and the bumps are pressed to each other to thereby deform the second synthetic resin layer, so that the plurality of bumps and the plurality of solder layers are in contact with each other.

9. The recording head according to claim 8, wherein the second synthetic resin layer covers a contact portion between the bump and the solder layer over a whole circumference thereof, and bonds the actuator unit and the printed circuit board to each other through the contact portion.

10. The recording head according to claim 9, wherein the second synthetic resin layer is formed for each of the plurality of terminals, and an edge portion of the second synthetic resin layer overlaps an edge portion of each of the openings which are formed in the first synthetic resin layer so as to correspond to the terminals.

* * * * *